United States Patent
Li et al.

(10) Patent No.: US 12,055,601 B2
(45) Date of Patent: Aug. 6, 2024

(54) METHOD OF IDENTIFYING A SHORT-CIRCUIT LIKE EVENT IN A CIRCUIT BREAKER

(71) Applicant: Hong Kong Applied Science And Technology Research Institute Co., Ltd., N.T. (HK)

(72) Inventors: Xin Li, NT (HK); Kwong Yin Tsang, Kowloon (HK); Qingchun Li, Shenzhen (CN); Tin Ho Li, NT (HK)

(73) Assignee: Hong Kong Applied Science And Technology Research Institute Co. Ltd, Shatin (HK)

( * ) Notice: Subject to any disclaimer, the term of this patent is extended or adjusted under 35 U.S.C. 154(b) by 188 days.

(21) Appl. No.: 17/960,283

(22) Filed: Oct. 5, 2022

(65) Prior Publication Data

US 2024/0118350 A1   Apr. 11, 2024

(51) Int. Cl.
*G01R 31/52* (2020.01)
*H02H 3/08* (2006.01)
*H02H 3/44* (2006.01)

(52) U.S. Cl.
CPC .............. *G01R 31/52* (2020.01); *H02H 3/08* (2013.01); *H02H 3/44* (2013.01)

(58) Field of Classification Search
CPC ....................................................... G01R 31/18
See application file for complete search history.

(56) References Cited

U.S. PATENT DOCUMENTS

| | | | |
|---|---|---|---|
| 6,844,737 B2 | 1/2005 | Leprettre et al. | |
| 2005/0078024 A1 | 4/2005 | Harrington | |
| 2015/0333505 A1* | 11/2015 | Andersson | H02H 9/005 361/87 |
| 2016/0294179 A1 | 10/2016 | Kennedy et al. | |
| 2019/0027348 A1* | 1/2019 | Pandurangan | H01J 49/0036 |
| 2019/0198274 A1 | 6/2019 | Koza | |
| 2020/0083699 A1 | 3/2020 | Kennedy et al. | |
| 2020/0244157 A1 | 7/2020 | Smith | |
| 2021/0143000 A1* | 5/2021 | Pandurangan | H01J 49/4215 |
| 2021/0389733 A1 | 12/2021 | Yer et al. | |

FOREIGN PATENT DOCUMENTS

| | | |
|---|---|---|
| CN | 105356355 A | 2/2016 |
| CN | 105680677 A | 6/2016 |
| CN | 106199145 A | 12/2016 |
| CN | 109066608 A | 12/2018 |
| CN | 111049099 A | 4/2020 |
| CN | 114006357 A | 2/2022 |
| CN | 114217242 A | 3/2022 |

* cited by examiner

*Primary Examiner* — Tung X Nguyen

(74) *Attorney, Agent, or Firm* — GableGotwals

(57) ABSTRACT

Described is a method of identifying a short-circuit (SC) like event in a circuit breaker (CB). The method comprises sampling an incoming current to the CB to determine a maximum value of a slope of a curve of the incoming current. The method includes sampling the incoming current again before a level of the incoming current reaches a predetermined, preset, selected, or calculated SC threshold value $TH_{SC}$ for the CB. The method involves determining from the sampled incoming current that a value of the slope of the incoming current has changed from its maximum slope value to a lower slope value to thereby determine that the incoming current is indicative of a SC like event and does not comprise a real SC event.

18 Claims, 3 Drawing Sheets

METHOD OF IDENTIFYING A SHORT-CIRCUIT LIKE EVENT IN A CIRCUIT BREAKER

FIELD OF THE INVENTION

The invention relates particularly, but not exclusively, to a method of identifying or detecting a short-circuit (SC) like event in a circuit breaker (CB). In particular, the invention relates to a digital real-time algorithm to identify and ride through the SC like event in a microsecond range to avoid false triggering of the CB.

BACKGROUND OF THE INVENTION

False triggering of a CB during start-up of, for example, equipment having a capacitive or inductive load is a common problem. "Short-circuit like" inrush currents may be induced during start-up of, for example, a capacitive load. This is a particularly serious issue in a direct current (DC) grid.

Furthermore, a protection level of a CB is typically not changeable or adjustable once the CB is installed. Electrical parameters, e.g., current rating and trip curve, of the CB cannot normally be changed arbitrarily except by re-installing the CB which is undesirable.

Among other things, what is therefore desired is an improved method of identifying or detecting a SC like event in a CB and to responding to such an event.

OBJECTS OF THE INVENTION

An object of the invention is to mitigate or obviate to some degree one or more problems associated with known methods of identifying or detecting a SC like event in a CB.

The above object is met by the combination of features of the main claims; the subclaims disclose further advantageous embodiments of the invention.

Another object of the invention is to mitigate or obviate to some degree one or more problems associated with known methods of responding to a SC like event in a CB.

Another object of the invention is to provide a controller for a CB configured to identify and ride through the SC like event within micro-seconds to avoid false triggering of the CB.

Another object of the invention is to provide a digital real-time algorithm to identify and ride through the SC like event within micro-seconds to avoid false triggering of the CB.

Another object of the invention is to enable dynamic reconfiguration of the CB without the need for reinstallation and/or physical modification of the CB.

One skilled in the art will derive from the following description other objects of the invention. Therefore, the foregoing statements of object are not exhaustive and serve merely to illustrate some of the many objects of the present invention.

SUMMARY OF THE INVENTION

In a first main aspect, the invention provides a method of identifying a SC like event in a CB. The method comprises sampling an incoming current to the CB to determine a maximum value of a slope of a curve of the incoming current. The method includes sampling the incoming current again before a level of the incoming current reaches a predetermined, preset, selected, or calculated SC threshold value $TH_{SC}$ for the CB. The method involves determining from the sampled incoming current that a value of the slope of the incoming current has changed from its maximum slope value to a lower slope value to thereby determine that the incoming current is indicative of a SC like event and does not comprise a real SC event.

Preferably, the step of determining that the incoming current is indicative of a SC like event comprises determining from the sampled incoming current that the value of the slope of the incoming current has changed from its maximum slope value to a lower slope value than expected. Preferably also, the step of determining that the incoming current is indicative of a SC like event comprises determining from the sampled incoming current that the value of the slope of the incoming current has changed from its maximum slope value to a lower slope value than would be expected for a real SC event.

The present invention preferably comprises a solid-state CB with a real-time fault identification function executed by a digital controller to distinguish between a SC current and a SC like inrush current in, for example, a low voltage direct current (LVDC) grid. The fault identification function can prevent the circuit breaker from false-tripping on start-up. This prevents or at least reduces false triggering of the CB during capacitive/inductive load start-up whilst maintaining in-time protection during a real short-circuit event.

In addition, the CB can preferably be configured with high flexibility, wherein the CB settings can be dynamically changed according to load conditions. This enables dynamic reconfiguration of the CB without the need for reinstallation and/or physical modification of the CB.

Preferably, the CB comprises a digital DC CB executing a digital real-time algorithm to identify and ride through an identified SC like event within micro-seconds to avoid false triggering of the CB. The algorithm preferably requires only real-time current data. The invention is also applicable to AC grids.

The CB may be configured with a user interface and/or a display for locally accessing a controller of the CB to enable a user to manually configure or reconfigure operating parameters of the CB such as, for example, current rating and one or more trip curves.

The CB is preferably configured for use in LVDC grids such as battery storage systems, data centers, e-mobility applications, solar photovoltaic applications, and DC or AC grids for buildings.

In a second main aspect, the invention provides a controller for a CB, the controller comprising a memory storing machine-readable instructions and a processor for executing the machine-readable instructions such that, when the processor executes the machine-readable instructions, it causes the controller to implement the steps of the first main aspect of the invention.

In a third main aspect, the invention provides a CB having a controller according to the second main aspect of the invention.

In a fourth main aspect, the invention provides a non-transitory computer-readable medium storing machine-readable instructions, wherein, when the machine-readable instructions are executed by a processor or a controller, they configure the processor or controller to implement the steps of the first main aspect of the invention.

The summary of the invention does not necessarily disclose all the features essential for defining the invention; the invention may reside in a sub-combination of the disclosed features.

The forgoing has outlined broadly the features of the present invention in order that the detailed description of the invention which follows may be better understood. Additional features and advantages of the invention will be described hereinafter which form the subject of the claims of the invention. It will be appreciated by those skilled in the art that the conception and specific embodiment disclosed may be readily utilized as a basis for modifying or designing other structures for carrying out the same purposes of the invention.

BRIEF DESCRIPTION OF THE DRAWINGS

The foregoing and further features of the present invention will be apparent from the following description of preferred embodiments which are provided by way of example only in connection with the accompanying figures, of which.

DESCRIPTION OF PREFERRED EMBODIMENTS

Figure 1:
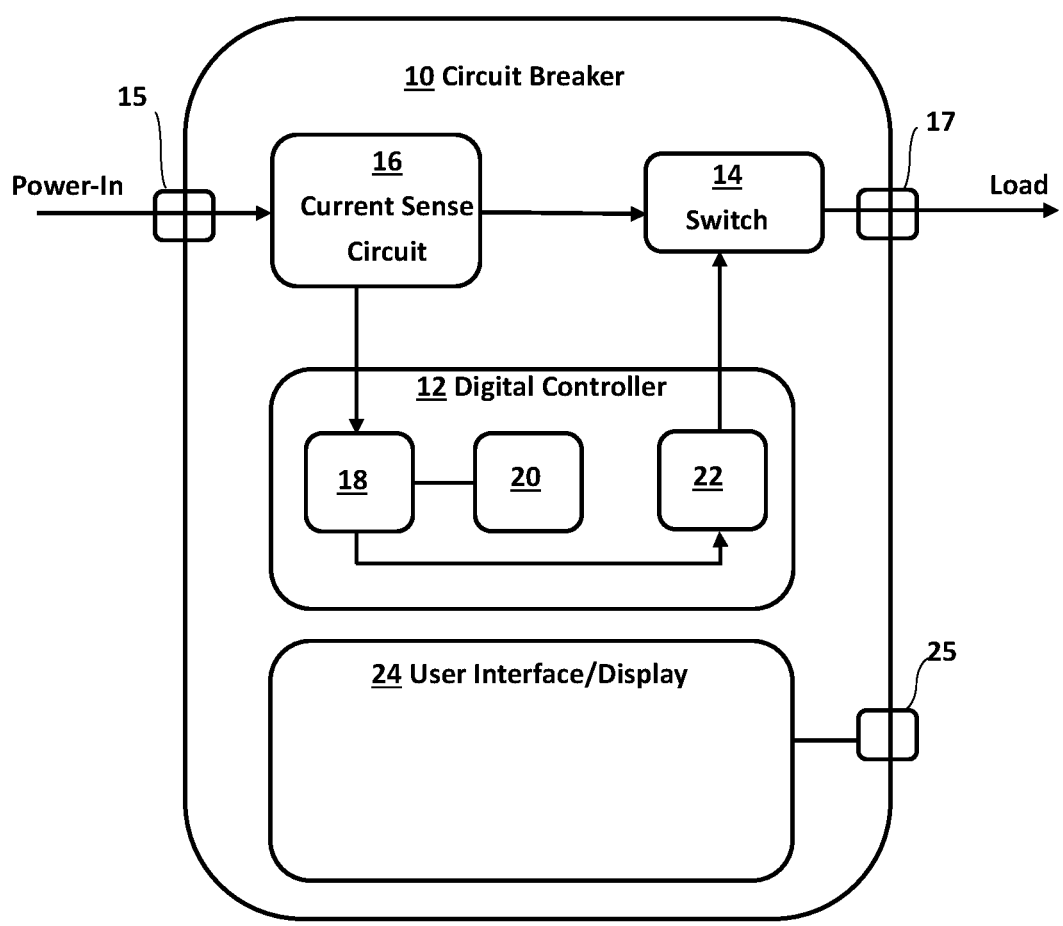
FIG. 1 comprises a schematic block diagram of a CB in accordance with the invention.

The following description is of preferred embodiments by way of example only and without limitation to the combination of features necessary for carrying the invention into effect.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments, but not other embodiments.

It should be understood that the elements shown in the FIGS., may be implemented in various forms of hardware, software, or combinations thereof. These elements may be implemented in a combination of hardware and software on one or more appropriately programmed general-purpose devices, which may include a processor, memory, and input/output interfaces.

The present description illustrates the principles of the present invention. It will thus be appreciated that those skilled in the art will be able to devise various arrangements that, although not explicitly described or shown herein, embody the principles of the invention and are included within its spirit and scope.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of systems and devices embodying the principles of the invention.

The functions of the various elements shown in the figures may be provided using dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. It is thus regarded that any means that can provide those functionalities are equivalent to those shown herein.

Referring to FIG. 1, a CB 10 comprises a digital controller 12, although any suitable controller for implementing the method according to the invention as hereinafter described could be utilized in the CB 10. The CB 10 comprises at least one switch 14 which receives an incoming current from a power-in input port 15. The switch 14 is connected to a current sense circuit 16 which receives the incoming current at the power-in input port 15 and measures parameters of the incoming current. The current sense circuit 16 feeds the incoming current to the switch 14 which, in turn, feeds the current to a load connected to a power-out output port 17. The current sense circuit 16 communicates measured parameters of the incoming current to at least one processor 18 of the digital controller 12. The digital controller includes at least one memory 20. The memory stores machine-readable instructions which, when executed by the processor 18, causes the digital controller 12 to implement various CB functions including the method according to the invention as described hereinafter. The digital controller 12 may implement the various CB functions through execution of one or more digital real-time algorithms. The digital controller 12 may also include a control circuit 22 which is controlled by the processor 18 to actuate the switch 14 to isolate, i.e., trip or break, the CB 10 from the incoming current in the event that the digital controller 12 identifies or detects the occurrence of a SC event, namely the rapid increase of the incoming current above a predetermined, pre-set, selected, or calculated SC threshold value $TH_{SC}$ for the CB 10. Any of the current sense circuit 16 and the control circuit 22 may comprise functional blocks of the processor 18 implemented through the execution of the machine-readable instructions by the processor 18.

It will be understood that the CB 10 may comprise multiple power-in input ports 15 and multiple power-out output ports 17 together with respective switches 14 and current sense circuits 16.

In some embodiments, the CB 10 may include a user interface and/or a display 24 for enabling a user to locally access the digital controller 12 to manually configure or reconfigure operating parameters of the CB 10 such as, for example, the current rating and one or more trip curves.

In some embodiments, the CB 10 may include a communication interface 25 to enable the operating parameters of the CB 10 to be configured or reconfigured from an external device such as a wireless communication device or a computer or the like. The communication interface may comprise a wireless communication interface and/or a physical communication interface. The CB 10, the wireless communication device or a computer or the like may comprise an internet of things (IoT) enabled device.

The operating parameters of the CB 10 may be dynamically configured or reconfigured according to load conditions. This enables configuration and reconfiguration of the CB 10 without the need for reinstallation and/or physical modification of the CB 10.

It will be understood that the structure of the CB 10 illustrated by FIG. 1 is exemplary of CBs 10 in which the method of the invention may be implemented, but that the method of the invention may be implemented in any suitable CB having other structural arrangements provided that such CBs include a controller with at least one processor and at least one memory.

The CB 10 may comprise a solid-state CB provisioned with a real-time fault identification function executed by the digital controller 12 to distinguish between a SC current (SC event) and a SC like inrush current (SC like event) in, for example, a LVDC grid. The fault identification function can prevent or at least reduce false tripping on start-up of the CB 10. This prevents or at least reduces false triggering or tripping of the CB 10 during capacitive/inductive load start-up whilst maintaining in-time protection during a real SC event. However, the CB 10 is able to identify SC like events caused by any situation in which a surge current or the like is received at the power-in input port 15 including, for example, connecting or plugging a device into a live power supply.

The CB 10 preferably implements the real-time fault identification function using at least one digital real-time algorithm to identify and ride through an identified SC like event within micro-seconds to avoid false triggering or tripping of the CB 10. The algorithm preferably requires only real-time current data.

Whilst the CB 10 is described herein as a DC device, it will be understood that the CB could be adapted to operate in AC grids.

The CB is preferably configured for use in LVDC grids such as battery storage systems, data centers, e-mobility applications, solar photovoltaic applications, and DC or AC grids for buildings.

Figure 2:
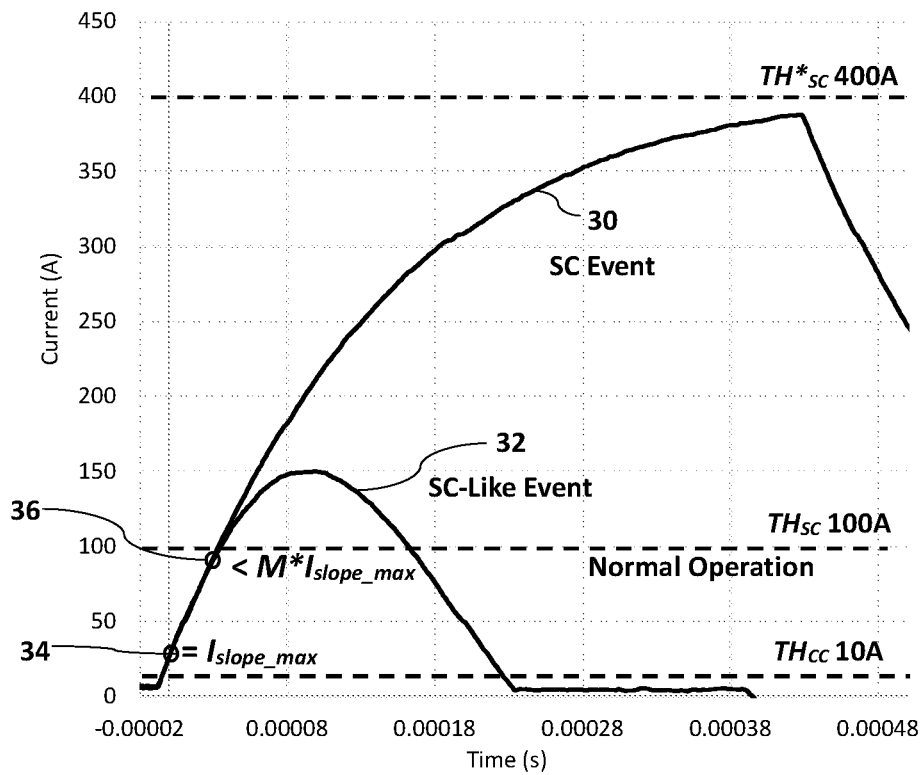
FIG. 2 is a graph illustrating the principles of the invention.
Figure 3:
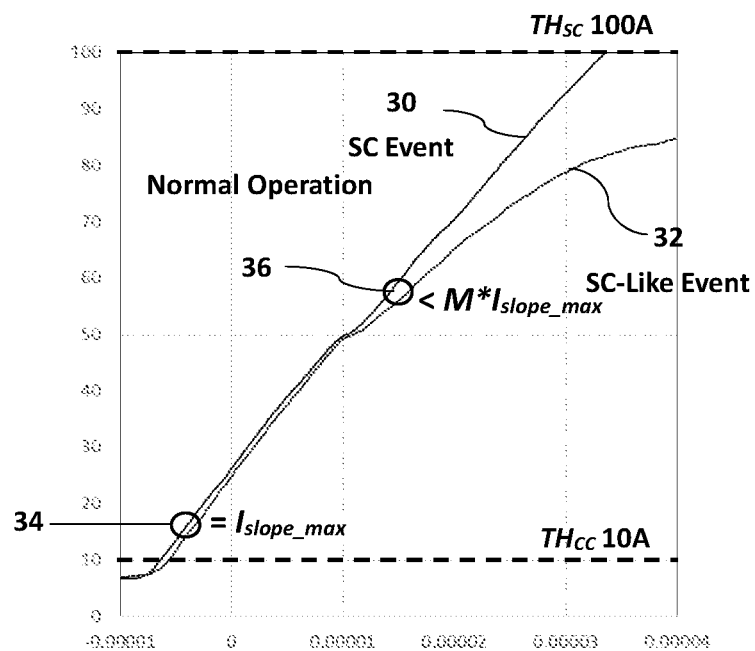
FIG. 3 is a blown-up portion of the graph of FIG. 2 to better explain the principles of the invention.

FIG. 2 is a graph illustrating principles of the invention whilst FIG. 3 provides a blown-up portion of the graph of FIG. 2 to better explain the principles of the invention.

Referring to FIG. 2, shown are two current curves, a first curve 30 comprising or indicative of a real SC event, namely, a SC being detected by the current sense circuit 16 where said SC current rapidly rises above a SC threshold value $TH_{SC}$ for the CB 10. In this example, the SC threshold value $TH_{SC}$ for the CB 10 is set at 100 Amps, but this is merely by way of example. Also shown is a second current curve 32 comprising or indicative of a SC like event, namely, a SC like current being detected by the current sense circuit 16 where said SC like current rapidly rises towards and subsequently exceeds said SC threshold value $TH_{SC}$ for the CB 10. In a conventional CB, both the SC event and the SC like event would cause the switch 14 in the CB 10 to be triggered to break the circuit between the power-in input port 15 and the power-out output port 17. However, in the case of the SC like event current curve 32, this would lead to false triggering of the CB 10 as it can be seen in FIG. 2 that the SC like event current curve 32 rapidly decreases to a normal operating level within a few microseconds.

The method of the invention involves continuously or periodically sampling the incoming current received at the power-in input port 15, preferably once the current exceeds a minimum current threshold value THcc, to detect or determine a maximum slope of the current curve 30, 32 of said incoming current. Only two sampling points 34, 36 are depicted in FIGS. 2 and 3, but it will be appreciated that there will be multiple (n) such sampling points in practice and that sampling will continue until at least a determination is made as to whether the incoming current is indicative of a real SC event in which case the switch 14 will be triggered, or the incoming current is indicative of a SC like event in which the switch 14 will not be triggered. In the event that a determination is made that the incoming current is indicative of a SC like event, sampling of the incoming current will preferably continue until the incoming current has returned to at least a normal operating level.

The method of identifying a SC like event in the CB 10 in accordance with the invention involves sampling the incoming current to determine a maximum value of a slope of the curve 30, 32 of the incoming current prior to a value of the incoming current reaching the SC threshold value $TH_{SC}$. This is indicated in FIG. 2 by the first sampling point 34 where one sampled value of the current slope is given as a maximum value, $I_{slope\_max}$. It will be understood that the step of continuously or periodically sampling the incoming current may determine a maximum slope value of the curve 30, 32 of the incoming current at any point prior to the value of the incoming current reaching the SC threshold value $TH_{SC}$. In other words, the digital controller 12 continuously or periodically calculates the slope of the curve 30, 32 of the incoming current and updates as necessary the maximum slope value, $I_{slope\_max}$, of said current curve 30, 32. The method includes sampling the incoming current at least one more time, but preferably sampling the incoming current multiple times continuously or periodically, in a time period before the level of the incoming current reaches the SC threshold value $TH_{SC}$ for the CB 10. The method involves determining from the sampled incoming current whether or not a value of the slope of the incoming current has changed from its maximum slope value, $I_{slope\_max}$, to a lower slope value, $<I_{slope\_max}$, in order to determine whether or not the incoming current is indicative of a SC like event.

In some embodiments, this may comprise determining from the sampled incoming current whether or not the value of the slope of the incoming current has changed from its maximum slope value, $I_{slope\_max}$, to a lower slope value, $<I_{slope\_max}$, than would be expected.

In yet other embodiments, this may comprise determining from the sampled incoming current whether or not the value of the slope of the incoming current has changed from its maximum slope value, $I_{slope\_max}$, to a lower slope value, $<I_{slope\_max}$, than would be expected for a real SC event. The value or values of slope that would be expected for an incoming current indicative of a real SC event may be determined from empirical data, may be calculated by the digital controller 12 in real-time, may be stored in the memory 20 of the digital controller 12 as a look-up table and/or may be determined from a trip curve preloaded into the digital controller 12 of the CB 10.

It is not immediately apparent in FIG. 2 that the slope of the current curve 32 for the SC like event has changed compared to the curve 30 of the SC event prior to the time at which the level of the incoming current reaches the SC threshold value $TH_{SC}$. However, FIG. 3 provides a blown-up portion of FIG. 2 in which it can be seen that, prior to the time at which the level of the incoming current reaches the SC threshold value $TH_{SC}$, the slope of the current curve 32 of the SC like event has indeed lessened by a noticeable amount compared to the current curve 30 of the SC event which defines the expected current curve 30 and thus slope values for a real SC event for the CB 10 based on its operating parameters.

It will be noted that, in FIGS. 2 and 3, the later sampled slope 36 of the current curve 32 of the SC like event is compared to the maximum slope value, $I_{slope\_max}$, modified by a predetermined, preset, selected, or calculated current slope factor M. If a subsequently sampled value of the slope of the curve 30, 32 of the incoming current is less than M times the maximum slope value, $I_{slope\_max}$, then it is determined that the incoming current is indicative of a SC like event. The current slope factor M is less than 1. The current slope factor M effectively comprises a degree or amount by which the subsequently sampled value of the slope of the curve 30, 32 of the incoming current must be less than the maximum slope value, $I_{slope\_max}$, for a determination to be made that the incoming current comprises or is indicative of a SC like event and does not comprise a real SC event. The current slope factor M is preferably adjustable. This has the advantage that the CB 10 can be fine-tuned to discriminate more accurately between SC like events and real SC events.

The method preferably includes the step of where, before the level of the incoming current reaches the SC threshold value $TH_{SC}$ and a determination has been made that the incoming current is indicative of a SC like event, elevating the SC threshold value $TH_{SC}$ to a temporary SC threshold value $TH^*_{SC}$. Raising the SC threshold value $TH_{SC}$ to the higher rated temporary SC threshold value $TH^*_{SC}$ prevents or reduces the SC like event being processed as akin to a real SC event and thereby prevents or reduces false triggering of the CB 10. In the example of FIGS. 2 and 3, the temporary SC threshold value $TH^*_{SC}$ is raised to 400 Amps, but other raised values may be applied provided these are sufficient or determined to be sufficient to prevent the identified SC like event triggering the CB 10.

The method may also include raising the SC threshold value $TH_{SC}$ to the higher rated temporary SC threshold value $TH^*_{SC}$ for a set period of time or period of time determined to be sufficient to prevent the identified SC like event triggering the CB 10.

The SC threshold value $TH_{SC}$ and/or the temporary SC threshold value $TH^*_{SC}$ may be adjustable manually or dynamically.

The method may include resetting the temporary SC threshold value $TH^*_{SC}$ to its previous SC threshold level $TH_{SC}$ or to a new SC threshold level once the identified SC like event is determined to have ended and/or once the period of time has expired. Preferably, however, the method includes resetting the temporary SC threshold value $TH^*_{SC}$ to its previous threshold level $TH_{SC}$ or to a new SC threshold level once a value of the incoming current is determined to be equal to or less than a minimum current threshold value $TH_{CC}$.

It is preferred that the incoming current is initially or first compared to the minimum current threshold value $TH_{CC}$ prior to the step of sampling the incoming current to determine the maximum value of the slope of the curve 30, 32 of the incoming current. If a value of the incoming current is equal to or less than the minimum current threshold value $TH_{CC}$, then the method returns to the step of sampling the incoming current.

In some embodiments, the memory 20 of the digital controller 12 is preloaded with one or more standard or conventional CB trip curves. The one or more standard or conventional CB trip curves may comprise the B, C, D and/or Z type trip curves.

In some embodiments, the expected slope value for a real SC event may be determined from the one or more standard or conventional CB trip curves preloaded into the memory 18.

Figure 4:
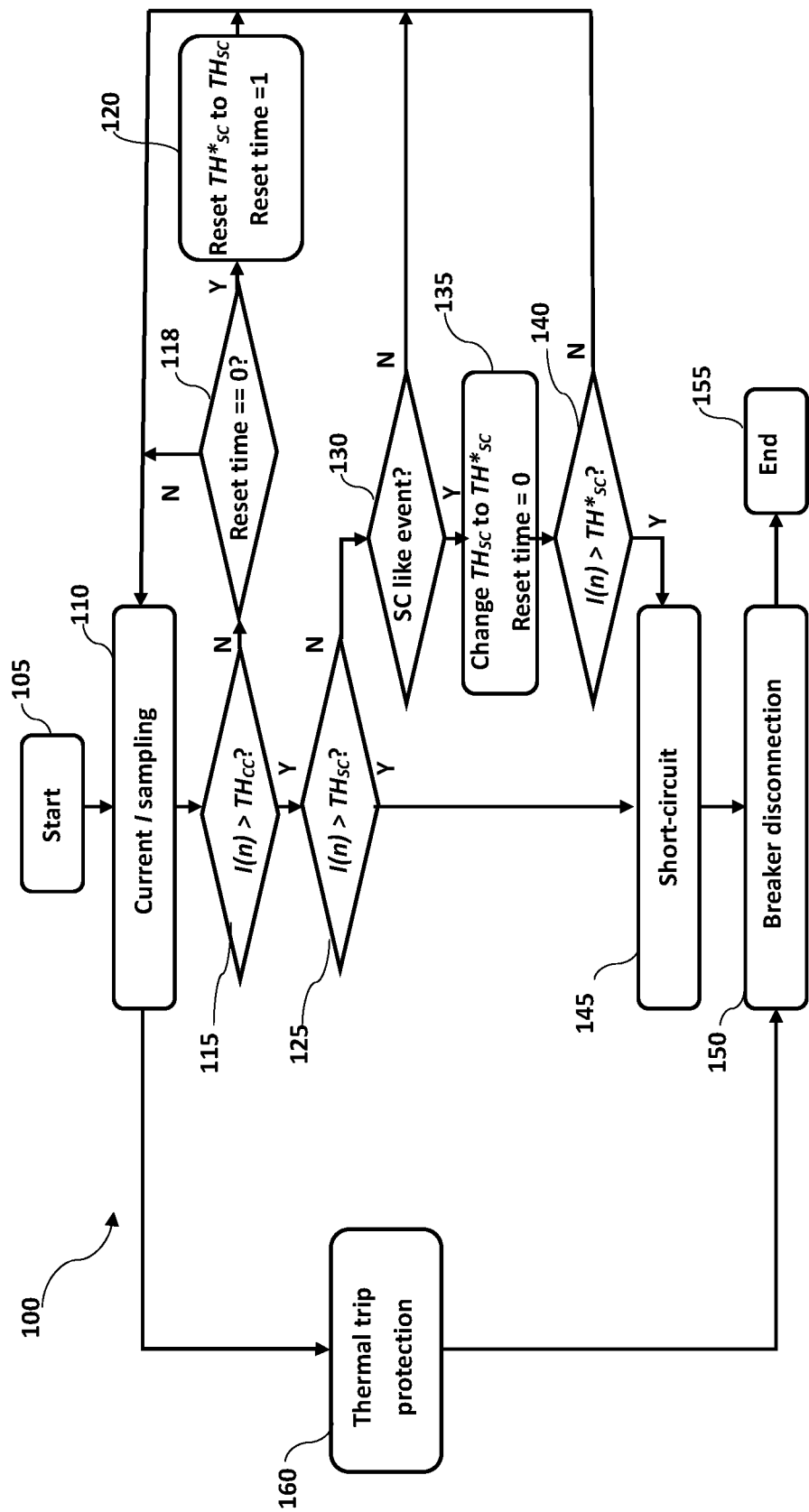
FIG. 4 is a flow diagram of a preferred method in accordance with the invention.

FIG. 4 provides a flow diagram more fully illustrating the method 100 in accordance with the invention. The method 100 commences at the start 105. In a next step 110, the incoming current I received at the power-in input port 15 of the CB 10 is continuously or periodically sampled by the current sense circuit 16. In a decision box 115, the digital controller 12 determines whether or not the sampled current I(n) is greater than the minimum current threshold value $TH_{CC}$. If the sampled current I(n) is determined to be less than or equal to the minimum current threshold value $TH_{CC}$, the method 100 returns to the step 110 of sampling the incoming current I. However, if the SC threshold value $TH_{SC}$ has previously been elevated to the temporary SC threshold value $TH^*_{SC}$ then, at step 120, the temporary SC threshold value $TH^*_{SC}$ is reset to the previous SC threshold value $TH_{SC}$ or to a new SC threshold value $TH_{SC}$ prior to the method 100 returning to the step 110 of sampling the incoming current I. Prior to step 120, the method 100 may include decision box 118 where a determination is made if a flag, e.g., reset time is set to 0. If the reset time period has not been set to 0, then the method 100 returns to step 110 without including step 120. Conversely, if the reset time has been set to 1, then the method 100 returns to step 110 via step 120. The reset time is just a flag, not a period of time.

If, however, the digital controller 12 determines at decision box 115 that the sampled current I(n) is greater than the minimum current threshold value $TH_{CC}$ then the method 100 proceeds to decision box 125.

At decision box 125, the digital controller 12 determines whether or not the sampled current I(n) is greater than the SC threshold value $TH_{SC}$. If the sampled current I(n) is determined to be less than or equal to the SC threshold value $TH_{SC}$, the method 100 proceeds to decision box 130 where the digital controller 12 determines whether or not the incoming current I received at the power-in input port 15 of the CB 10 comprises or is indicative of a SC like event. The digital controller 12 makes this determination based on the sampled slope of the incoming current I in the manner hereinbefore described. Where at decision box 130, the digital controller 12 determines that the incoming current I does not (yet) comprise or is indicative of a SC like event then the method 100 returns to the step 110 of sampling the incoming current I. Where at decision box 130, the digital controller 12 determines that the incoming current I does comprise or is indicative of a SC like event then the method 100 proceeds to step 135 where the digital controller 12 sets the SC threshold value $TH_{SC}$ to a temporarily elevated value of the temporary SC threshold value $TH^*_{SC}$.

Following step 135, the digital controller 12, at decision box 140, determines whether or not the sampled current I(n) is greater than the elevated value of the temporary SC threshold value $TH^*_{SC}$. If the sampled current I(n) is less than or equal to the elevated value of the temporary SC threshold value $TH^*_{SC}$, the method 100 returns to the step 110 of sampling the incoming current I. However, if, at decision box 140, the sampled current I(n) is determined to be greater than the elevated value of the temporary SC threshold value $TH^*_{SC}$, the method 100 proceeds to step 145 where the digital controller 12 identifies a SC event has occurred and, at step 150, triggers the CB 10 to operate the switch 14 to break the circuit between the power-in input port 15 and the power-out output port 17. The method 100 ends at step 155 after the digital controller 12 triggers the CB 10 in response to determining that a SC event has occurred.

Returning to decision box 125, if the sampled current I(n) is determined to be greater than the SC threshold value $TH_{SC}$, the method 100 proceeds to steps 145, 150 and 155.

The CB 10 may include a thermal trip protection circuit as a functional module of the digital controller 12 such that the method 100 includes a step 160 of thermally tripping the CB 10 in the event of a thermal protection issue being identified by the digital controller 12.

The apparatus described above may be implemented at least in part in software. Those skilled in the art will appreciate that the apparatus described above may be implemented at least in part using general purpose computer equipment or using bespoke equipment.

Here, aspects of the methods and apparatuses described herein can be executed on any apparatus comprising the communication system. Program aspects of the technology can be thought of as "products" or "articles of manufacture" typically in the form of executable code and/or associated data that are carried on or embodied in a type of machine-readable medium. "Storage" type media include any or all the memory of the mobile stations, computers, processors or the like, or associated modules thereof, such as various semiconductor memories, tape drives, disk drives, and the like, which may provide storage at any time for the software programming. All or portions of the software may at times be communicated through the Internet or various other telecommunications networks. Such communications, for example, may enable loading of the software from one computer or processor into another computer or processor. Thus, another type of media that may bear the software elements includes optical, electrical, and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to tangible non-transitory "storage" media, terms such as computer or machine "readable medium" refer to any medium that participates in providing instructions to a processor for execution.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

In the claims which follow and in the preceding description of the invention, except where the context requires otherwise due to express language or necessary implication, the word "comprise" or variations such as "comprises" or "comprising" is used in an inclusive sense, i.e., to specify the presence of the stated features but not to preclude the presence or addition of further features in various embodiments of the invention.

It is to be understood that, if any prior art publication is referred to herein, such reference does not constitute an admission that the publication forms a part of the common general knowledge in the art.

The invention claimed is:

1. A method of identifying a short-circuit (SC) like event in a circuit breaker (CB), the method comprising:
sampling an incoming current to the CB to determine a maximum value of a slope of a curve of the incoming current;
sampling the incoming current again before a level of the incoming current reaches a predetermined, preset, selected, or calculated SC threshold value $TH_{SC}$ for the CB; and
determining from the sampled incoming current that a value of the slope of the incoming current has changed from its maximum slope value to a lower slope value to thereby determine that the incoming current is indicative of a SC like event and does not comprise a real SC event.

2. The method of claim 1, wherein the step of determining that the incoming current is indicative of a SC like event comprises determining from the sampled incoming current that the value of the slope of the incoming current has changed from its maximum slope value to a lower slope value than would be expected for a real SC event.

3. The method of claim 1, wherein a current slope factor M is predetermined, preset, selected, or calculated such that if a subsequently sampled value of the slope of the curve of the incoming current is less than M times the maximum slope value then it is determined that the incoming current is indicative of a SC like event, where the current slope factor M is less than 1.

4. The method of claim 3, wherein the maximum slope value of the curve of the incoming current is determined as comprising a maximum value $I_{slope\_max}$ of the slope of the current curve at any point on the curve of the incoming current prior to the incoming current reaching the SC threshold value $TH_{SC}$.

5. The method of claim 1, wherein, before the level of the incoming current reaches the predetermined, preset, selected, or calculated SC threshold value $TH_{SC}$ and a determination has been made that the incoming current is indicative of a SC like event, elevating the SC threshold value $TH_{SC}$ to a temporary SC threshold value $TH^*_{SC}$.

6. The method of claim 5, wherein the elevated temporary SC threshold value $TH^*_{SC}$ is raised to a predetermined, preset, selected, or calculated level $TH^*_{SC}$ determined to be sufficient to prevent the identified SC like event triggering the CB.

7. The method of claim 5, wherein the elevated temporary SC threshold value $TH^*_{SC}$ is raised to a predetermined, preset, selected, or calculated elevated level and for a period of time determined to be sufficient to prevent the identified SC like event triggering the CB.

8. The method of claim 5, wherein the temporary SC threshold value $TH^*_{SC}$ is reset to its previous threshold level $TH_{SC}$ or to a new SC threshold level once the identified SC like event is determined to have ended and/or once a period of time has expired.

9. The method of claim 5, wherein the temporary SC threshold value $TH^*_{SC}$ is reset to its previous threshold level $TH_{SC}$ or to a new SC threshold level once a value of the incoming current is determined to be equal to or less than a minimum current threshold value $TH_{CC}$.

10. The method of claim 5, wherein any of the slope factor M, the SC threshold value $TH_{SC}$ and/or the temporary SC threshold value $TH^*_{SC}$ is adjustable.

11. The method of claim 1, wherein the incoming current is compared to a minimum current threshold value $TH_{CC}$ prior to the step of sampling the incoming current to determine the maximum value of the slope of the curve of the incoming current and, if a value of the incoming current is equal to or less than the minimum current threshold value $TH_{CC}$, then the method returns to the step of sampling the incoming current.

12. The method of claim 1, wherein the CB has a controller with a memory and the method includes preloading the memory of said controller with one or more standard or conventional CB trip curves.

13. The method of claim 12, wherein the one or more standard or conventional CB trip curves comprise B, C, D and/or Z type trip curves.

14. The method of claim 12, wherein the slope value expected for a real SC event is determined from the one or more standard or conventional CB trip curves preloaded into the CB controller memory.

15. The method of claim 12, wherein one or more electrical parameters for the CB are loaded into the memory of the controller.

16. The method of claim 15, wherein said one or more electrical parameters are loaded into the memory via any one or more of the following: a user interface of the CB; a wireless device in wireless communication with the CB; and/or an external computer in communication with the CB.

17. A controller for a circuit breaker (CB), the controller comprising a memory storing machine-readable instructions and a processor for executing the machine-readable instructions such that, when the processor executes the machine-readable instructions, it configures the controller to implement the steps of:
sampling an incoming current to the CB to determine a maximum value of a slope of a curve of the incoming current;
sampling the incoming current again before a level of the incoming current reaches a predetermined, preset, selected, or calculated short-circuit (SC) threshold value $TH_{SC}$ for the CB; and
determining from the sampled incoming current that a value of the slope of the incoming current has changed from its maximum slope value to a lower slope value to thereby determine that the incoming current is indicative of a SC like event and does not comprise a real SC event.

18. A circuit breaker (CB) having a controller, the controller comprising a memory storing machine-readable instructions and a processor for executing the machine-readable instructions such that, when the processor executes the machine-readable instructions, it configures the controller to implement the steps of:
sampling an incoming current to the CB to determine a maximum value of a slope of a curve of the incoming current;
sampling the incoming current again before a level of the incoming current reaches a predetermined, preset, selected, or calculated short-circuit (SC) threshold value $TH_{SC}$ for the CB; and
determining from the sampled incoming current that a value of the slope of the incoming current has changed from its maximum slope value to a lower slope value to thereby determine that the incoming current is indicative of a SC like event and does not comprise a real SC event.

* * * * *